(12) United States Patent
Cao

(10) Patent No.: US 7,976,211 B2
(45) Date of Patent: Jul. 12, 2011

(54) LIGHT BULB UTILIZING A REPLACEABLE LED LIGHT SOURCE

(76) Inventor: Densen Cao, Sandy, UT (US)

( * ) Notice: Subject to any disclaimer, the term of this patent is extended or adjusted under 35 U.S.C. 154(b) by 581 days.

(21) Appl. No.: 11/938,131

(22) Filed: Nov. 9, 2007

(65) Prior Publication Data

US 2008/0062703 A1 Mar. 13, 2008

Related U.S. Application Data

(63) Continuation-in-part of application No. 11/397,323, filed on Apr. 4, 2006, now Pat. No. 7,728,345.

(51) Int. Cl.
*H01R 33/945* (2006.01)
(52) U.S. Cl. .................. 362/650; 362/649
(58) Field of Classification Search .......... 362/649, 362/650, 651
See application file for complete search history.

(56) References Cited

U.S. PATENT DOCUMENTS

| | | | |
|---|---|---|---|
| 1,151,377 A * | 8/1915 | Nash ........................ 362/650 |
| 4,240,090 A | 12/1980 | Hughes |
| 4,394,679 A | 7/1983 | Hawrylo |
| 4,674,011 A | 6/1987 | Patton |
| 4,675,575 A | 6/1987 | Smith |
| 4,727,289 A | 2/1988 | Uchida |
| 5,055,892 A | 10/1991 | Gardner |
| 5,160,200 A | 11/1992 | Cheselske |
| 5,174,646 A | 12/1992 | Siminovitch |
| 5,349,599 A | 9/1994 | Larkins |
| 5,414,281 A | 5/1995 | Watabe |
| 5,463,280 A | 10/1995 | Johnson |
| 5,535,230 A | 7/1996 | Abe |
| 5,575,459 A * | 11/1996 | Anderson ..................... 362/650 |
| 5,595,438 A | 1/1997 | Burd |
| 5,655,830 A | 8/1997 | Ruskouski |
| 5,688,042 A | 11/1997 | Madadi |
| 5,707,139 A | 1/1998 | Haitz |
| 5,721,430 A | 2/1998 | Wong |
| 5,758,951 A | 6/1998 | Haitz |
| 5,765,940 A | 6/1998 | Levy |
| 5,803,579 A | 9/1998 | Turnbull |
| 5,806,965 A | 9/1998 | Deese |
| 5,813,752 A | 9/1998 | Singer |
| 5,890,794 A | 4/1999 | Abtahi |
| 5,941,626 A | 8/1999 | Yamuro |
| 5,941,631 A | 8/1999 | Hsu |
| 5,947,588 A | 9/1999 | Huang |
| 5,982,092 A | 11/1999 | Chen |
| 6,015,979 A | 1/2000 | Sugiura |
| 6,045,240 A | 4/2000 | Hochstein |
| 6,149,283 A | 11/2000 | Conway |
| 6,220,722 B1 * | 4/2001 | Begemann ..................... 362/650 |
| 6,238,077 B1 | 5/2001 | Ramer |
| 6,355,946 B1 | 3/2002 | Ishinaga |
| 6,357,889 B1 | 3/2002 | Duggal |
| 6,402,338 B1 | 6/2002 | Mitzel |

(Continued)

OTHER PUBLICATIONS

Pending U.S. Appl. No. 12/785,203, Office Action dated Nov. 2, 2010.

(Continued)

*Primary Examiner* — David V Bruce

(57) ABSTRACT

The present invention is a light bulb featuring a removable LED light source. The preferred source being a lighting source with a three dimensional lead frame as disclosed in the parent applications to this application. Control circuitry is included to convert electrical power into power usable by the LEDs.

24 Claims, 7 Drawing Sheets

U.S. PATENT DOCUMENTS

| | | | |
|---|---|---|---|
| 6,412,971 B1 | 7/2002 | Wojnarowski | |
| 6,478,453 B2 | 11/2002 | Lammers | |
| 6,499,860 B2 | 12/2002 | Begemann | |
| 6,502,952 B1 | 1/2003 | Hartley | |
| 6,504,180 B1 | 1/2003 | Hermans | |
| 6,541,800 B2 | 4/2003 | Barnett | |
| 6,561,680 B1 | 5/2003 | Shih | |
| 6,577,073 B2 | 6/2003 | Shimizu | |
| 6,580,228 B1 | 6/2003 | Chen | |
| 6,601,962 B1 | 8/2003 | Ehara | |
| 6,635,987 B1 | 10/2003 | Wojnarowski | |
| 6,709,132 B2 | 3/2004 | Ishibashi | |
| 6,715,900 B2 | 4/2004 | Zhang | |
| 6,786,625 B2 | 9/2004 | Wesson | |
| 6,815,241 B2 | 11/2004 | Wang | |
| 6,840,654 B2 | 1/2005 | Guerrieri | |
| 6,903,380 B2 | 6/2005 | Barnett | |
| 6,948,829 B2 | 9/2005 | Verdes | |
| 6,974,233 B1 | 12/2005 | Aubrey | |
| 6,982,518 B2 | 1/2006 | Chou | |
| 7,128,454 B2 | 10/2006 | Kim | |
| 7,150,553 B2 | 12/2006 | English | |
| 7,196,358 B1 | 3/2007 | Chen | |
| 7,490,959 B2 | 2/2009 | Tsuda | |
| 7,588,351 B2 * | 9/2009 | Meyer | 362/650 |
| 7,726,858 B2 * | 6/2010 | Sato et al. | 362/538 |
| 2002/0113244 A1 | 8/2002 | Barnett | |
| 2003/0031032 A1 | 2/2003 | Wu | |
| 2003/0117797 A1 | 6/2003 | Sommers | |
| 2004/0095738 A1 | 5/2004 | Juang | |
| 2004/0201025 A1 | 10/2004 | Barnett | |
| 2004/0264196 A1 | 12/2004 | Shu | |
| 2005/0007772 A1 | 1/2005 | Yen | |
| 2005/0174780 A1 | 8/2005 | Park | |
| 2005/0194607 A1 | 9/2005 | Barnett | |
| 2005/0243550 A1 * | 11/2005 | Stekelenburg | 362/650 |
| 2005/0254246 A1 | 11/2005 | Huang | |
| 2006/0092637 A1 | 5/2006 | Yeh | |
| 2006/0138440 A1 | 6/2006 | Jyo | |
| 2006/0232974 A1 * | 10/2006 | Lee et al. | 362/650 |
| 2007/0236935 A1 | 10/2007 | Wang | |
| 2007/0253202 A1 | 11/2007 | Wu | |
| 2008/0105886 A1 | 5/2008 | Borner | |
| 2008/0197374 A1 | 8/2008 | Sung | |

OTHER PUBLICATIONS

Pending U.S. Appl. No. 12/731,939, Office Action dated Nov. 8, 2010.
Pending U.S. Appl. No. 12/296,274, Office Action dated Jan. 6, 2011.
PCT Application, Serial No. PCT/US2007/065995, Written Opinion of the International Searching Authority, Jun. 20, 2008.

* cited by examiner

LIGHT BULB UTILIZING A REPLACEABLE LED LIGHT SOURCE

CROSS-REFERENCES TO RELATED APPLICATIONS

This Application is a continuation-in-part of prior U.S. application Ser. No. 11/397,323, filed Apr. 4, 2006, now U.S. Pat. No. 7,728,345, which is in turn a continuation-in-part of U.S. application Ser. No. 10/773,123, filed Feb. 5, 2004, now abandoned, which is a continuation of U.S. application Ser. No. 09/938,875, filed Aug. 24, 2004, now U.S. Pat. No. 6,746,885. Each of these patent applications is hereby incorporated by reference in their entirety.

FIELD OF THE INVENTION

The present invention relates to the field of lighting sources and more particularly relates to a light bulb, usable in standard incandescent lighting fixtures and also utilizing a replaceable LED as a lighting source.

BACKGROUND OF THE INVENTION

Since Edison's invention of the incandescent lamp, lighting has never been the same. The "light bulb," as they have come to be known, is perhaps one of the most ubiquitous and most little thought of elements in modern society. The whole system has become standardized in design and construction so that standard sockets are installed in new homes that will fit a standard bulb, lamps use standard bulbs of a given size, and new lighting fixtures feature sockets fitting whatever type of standard bulb the purchaser desires. The technology is very simple and light bulbs are mass produced to the point where consumers think nothing of just throwing away burnt out bulbs and going to the local grocery store to buy more.

However, society has become more energy and recourse conscious. As a result, consumers demand more efficient and longer lasting lighting solutions. Some governments are even considering banning incandescent bulbs. To this effect, halogen and compact fluorescent bulbs have been developed for consumer use. Halogens, unfortunately, do not use the standard bulb sockets that are present in almost every home and office. Compact fluorescents do use standard sockets and do use less energy, but they tend to be larger and are also meant to be disposed as a unit when the bulb reaches the end of its useful life. The disposal of the compact fluorescence lamp also results in environmental issues since they contain mercury.

LED's have recently been investigated as more efficient and environmental friendly light source. The present invention is an LED sourced light bulb where the LEDs are mounted upon a stable and replaceable frame, thereby reducing resources lost in disposal and associated cost. The present invention represents a departure from the prior art in that the light bulbs of the present invention allows for replacement of just the LED light source while retaining the majority of the body of the bulb. The present invention may be adapted for any type of socket interface, and it is preferred to use the standard light bulb socket, which would allow for interchange with the majority of sockets in the US and worldwide.

SUMMARY OF THE INVENTION

In view of the foregoing disadvantages inherent in the known types of light bulbs, this invention provides a light bulb utilizing an LED lighting source. As such, the present invention's general purpose is to provide a new and improved light bulb that is useable in standard light sockets available today while having most of its components reusable when the LED components eventually fail. It is also part of the invention's purpose to allow for the efficient use of LEDs, that is that there is maximum dissipation of heat generated by the LEDs for their most efficient use.

To accomplish these objectives, the light bulb comprises a socket base, an LED light source that is removable from the base and a removable cover. Control circuitry resides within the socket base to control the LEDs and regulate the power supply. Ideally, a removable inner socket is provided as an intermediary between the socket base and the LED lighting source.

The more important features of the invention have thus been outlined in order that the more detailed description that follows may be better understood and in order that the present contribution to the art may better be appreciated. Additional features of the invention will be described hereinafter and will form the subject matter of the claims that follow.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENT

With reference now to the drawings, the preferred embodiment of the light bulb is herein described. It should be noted that the articles "a", "an", and "the", as used in this specification, include plural referents unless the content clearly dictates otherwise.

Figure 1:
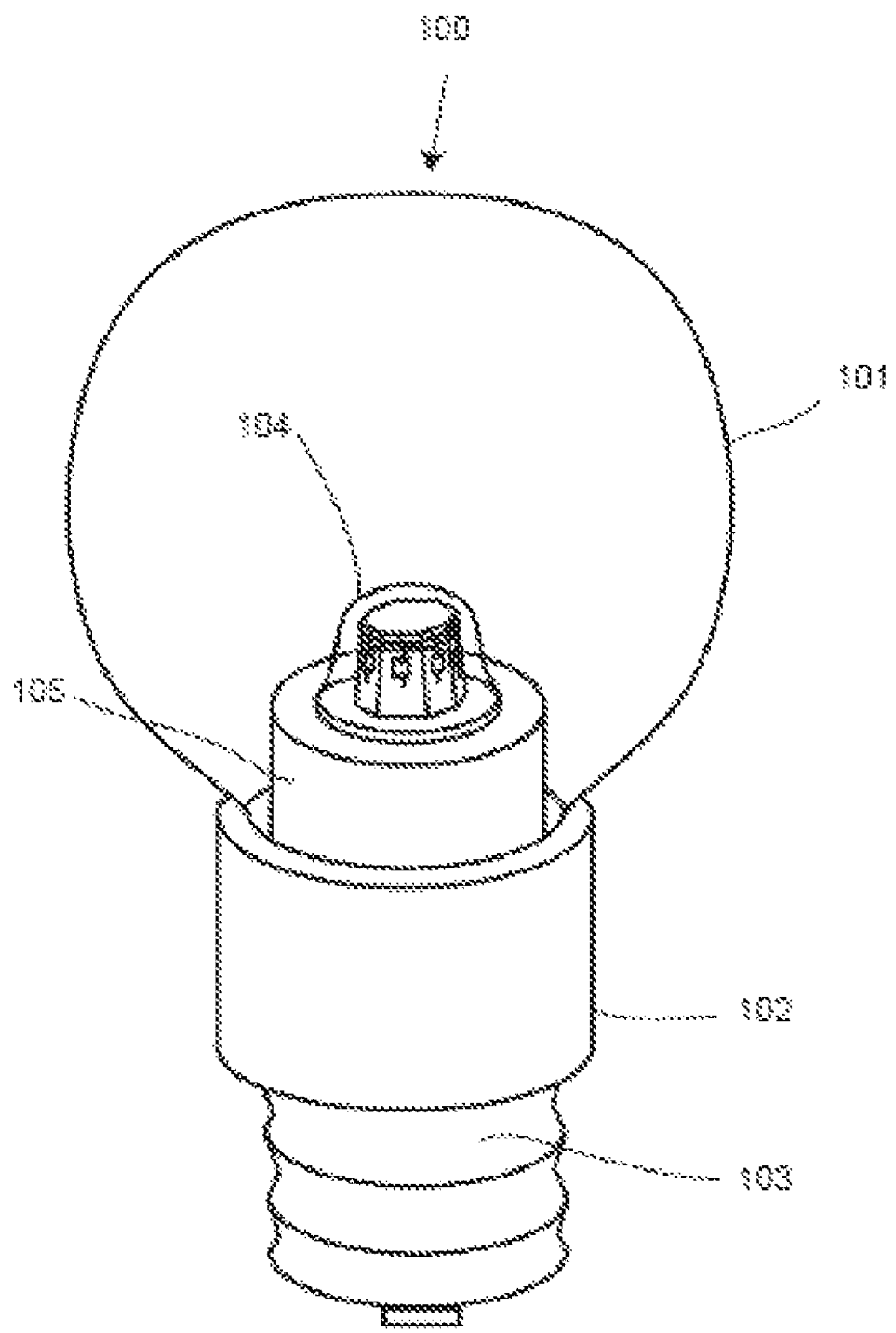
FIG. 1 is a side elevation of a light bulb according to the present invention.

With reference to FIG. 1, depicting a standard light bulb 100 with an LED light source 104, having a cover 101 (type A), which can be glass or transparent plastic and a light base 102. Base 102 houses control circuitry and other components necessary for the function of the LEDs and it has a threaded portion 103, which screws into a standard light socket. The replaceable LED unit 104, which disclosed in parent U.S. application Ser. No. 11/397,323, resides within the bulb cover, mounted upon an internal socket 105 which mates with both the LED unit 104 and the inside of the light base 102. The socket 105 also acts as heat sink to dissipate the heat from LED. LED unit may be any type of unit in the prior art or later designed, however it is preferred to use LED units such as described in this Application's ancestor applications and patents. In this depicted embodiment, the LED unit 104 will emit light in an arc from 5 to 360° in the horizontal plane and from a 5 to 360° arc in the vertical plane, which is comparable to a standard incandescent light bulb.

Figure 2:
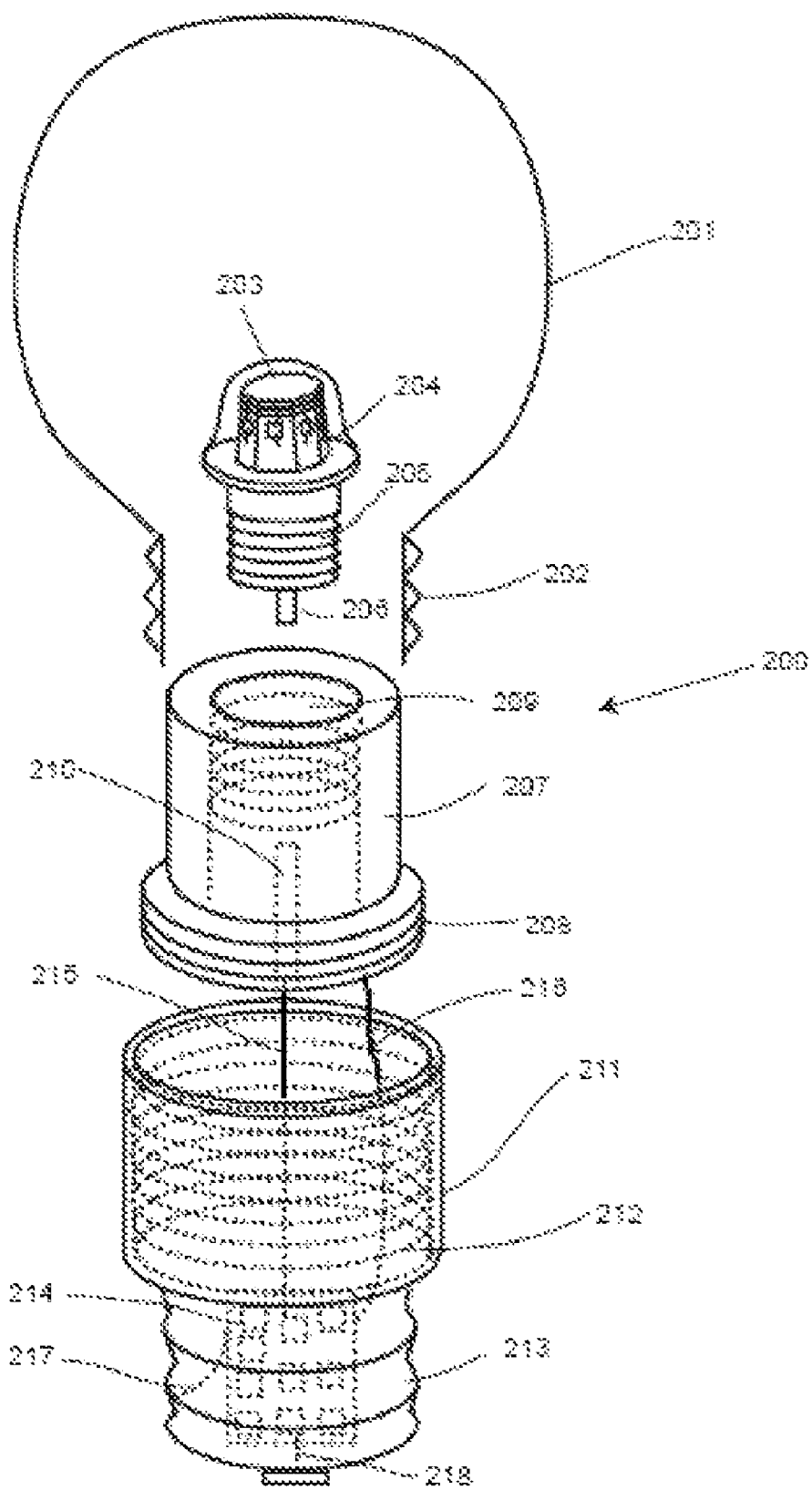
FIG. 2 is an exploded view, in partial transparency, of the light bulb of FIG. 1.

The construction of the bulb is relatively simple, as shown in FIG. 2. Cover 201 features a threaded base 202 which screws into threads 212 in the socket base 211. LED unit 203 is at least one replaceable LED with a three dimensional lead frame 204, a threaded base/electrode 205, and another electrode pin 206. Threaded base 205 screws into internal socket 207 through hole 209. While shown as threaded, it should be understood that any interlocking structure will suffice to keep the LED mounted. The internal socket 207 features a threaded base 208 to mate with threads 212 and attach to the socket base 211, under cover 201. When assembled, electrical connector 210 connects to electrode 206. Socket base 211 is features a standard threaded base 213 and houses an electronic circuit 214 to convert 110 or 220 VAC to DC to drive the LED. Electronic circuit 214 has outputs 215 and 216 to LED electrodes and also has outputs 217 and 218 to the threaded base. To increase total light output intensity, the number of replaceable LED can be ranged from 1 to n, which is an integer larger than 1. LED unit 203 may be either removable or fixed within the internal socket.

In this embodiment, the number of replaceable LEDs as a light source can be 1 to n, which is an integer larger than 1. When the number of LEDs is larger than 1, the LEDs can be mounted along with socket in different angles to achieve different lighting effects. It should also be understood that the cover 201 may be made in a fixed, non-removable, relationship with the socket base 21, though this would preclude LED replacement.

Figure 3:
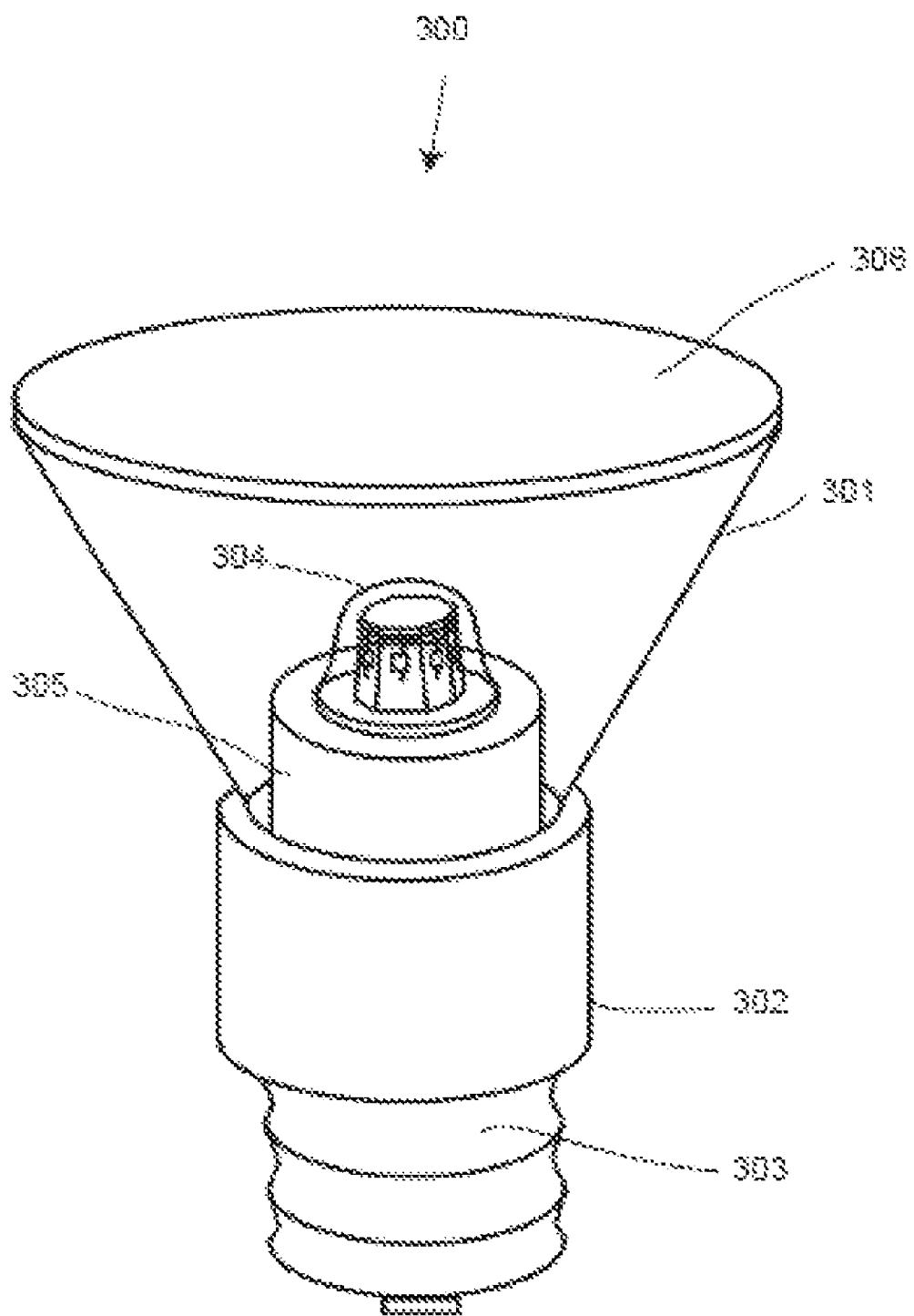
FIG. 3 is a side elevation of a down-lighting light bulb according to the present invention.
Figure 4:
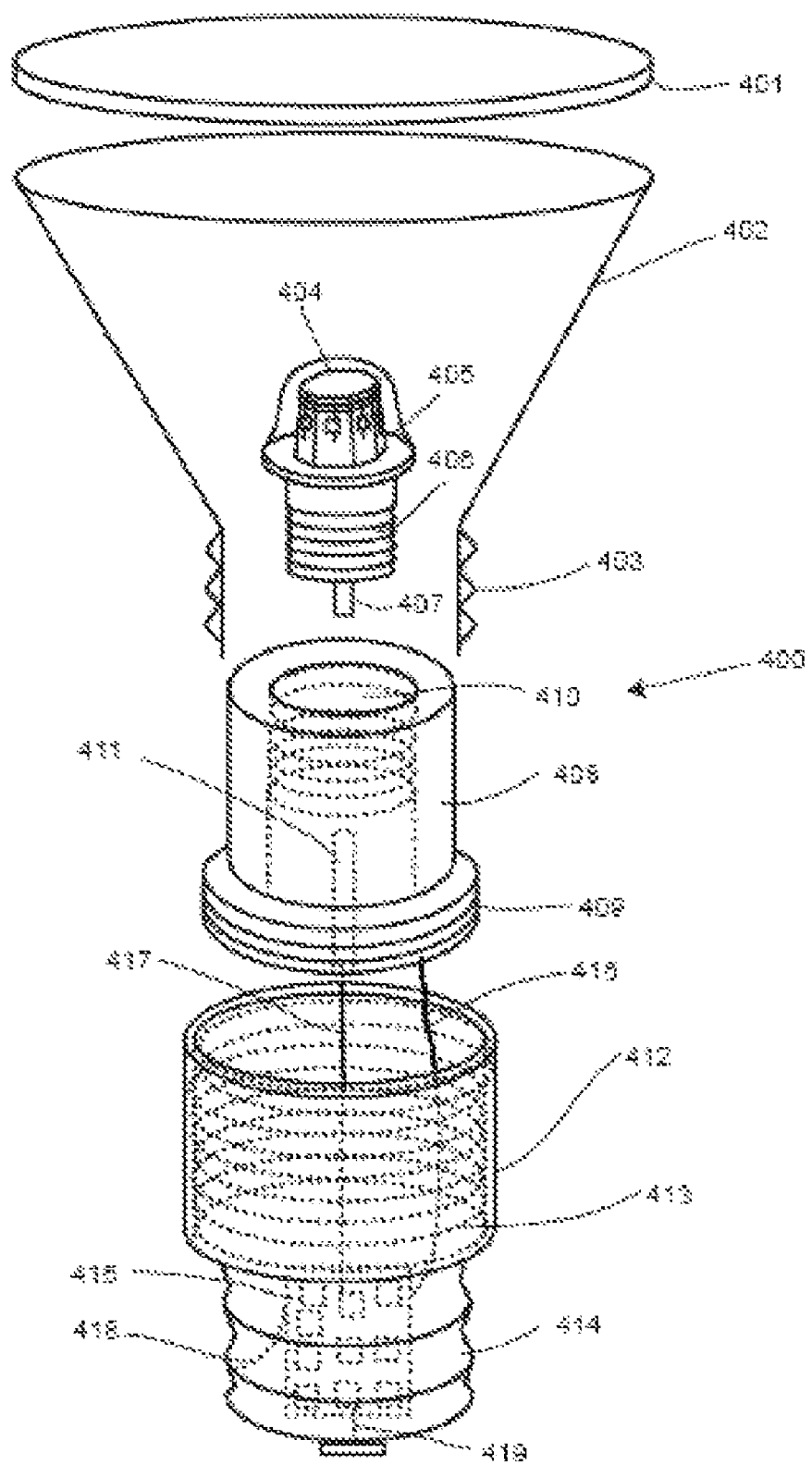
FIG. 4 is an exploded view, in partial transparency, of the light bulb of FIG. 3.

FIG. 3 depicts a light bulb embodiment that is a down lighting light with a replaceable LED 300 (type R) with an LED light source 304, having a reflecting cup 301 as a cover which can be glass or transparent plastic and a light base 302. Reflecting cup features a cover or lens 306 to help beam dispersion and reflector protection. Like the first embodiment, base 302 houses control circuitry and other components necessary for the function of the LEDs and it has a threaded portion 303, which screws into a standard light socket. The replaceable LED unit 304 resides within the bulb cover, mounted upon an internal socket 305 which mates with both the LED unit 304 and the inside of the light base 302. The socket 305 also act heat sink to dissipate the heat from LED. The construction of the bulb is shown in FIG. 4. Cover 402 features lens 401 a threaded base 403 which screws into threads 413 in the socket base 412. LED unit 404 is a replaceable LED with a three dimensional lead frame 405, a threaded base/electrode 406, and another electrode pin 407. Threaded base 406 screws into internal socket 408 through hole 410. The internal socket 408 features a threaded base 409 to mate with threads 413 and attach to the socket base 412, under cover 402. When assembled, electrical connector 411 connects to electrode 407. Socket base 412 is features a standard threaded base 414 and houses an electronic circuit 415 to convert 110 or 220 VAC to DC to drive the LED. Electronic circuit 415 has outputs 416 and 417 to LED electrodes and also has outputs 418 and 419 to the threaded base. As before, to increase total light output intensity, the number of replaceable LEDs can be ranged from 1 to n, which is an integer larger than 1.

Figure 5:
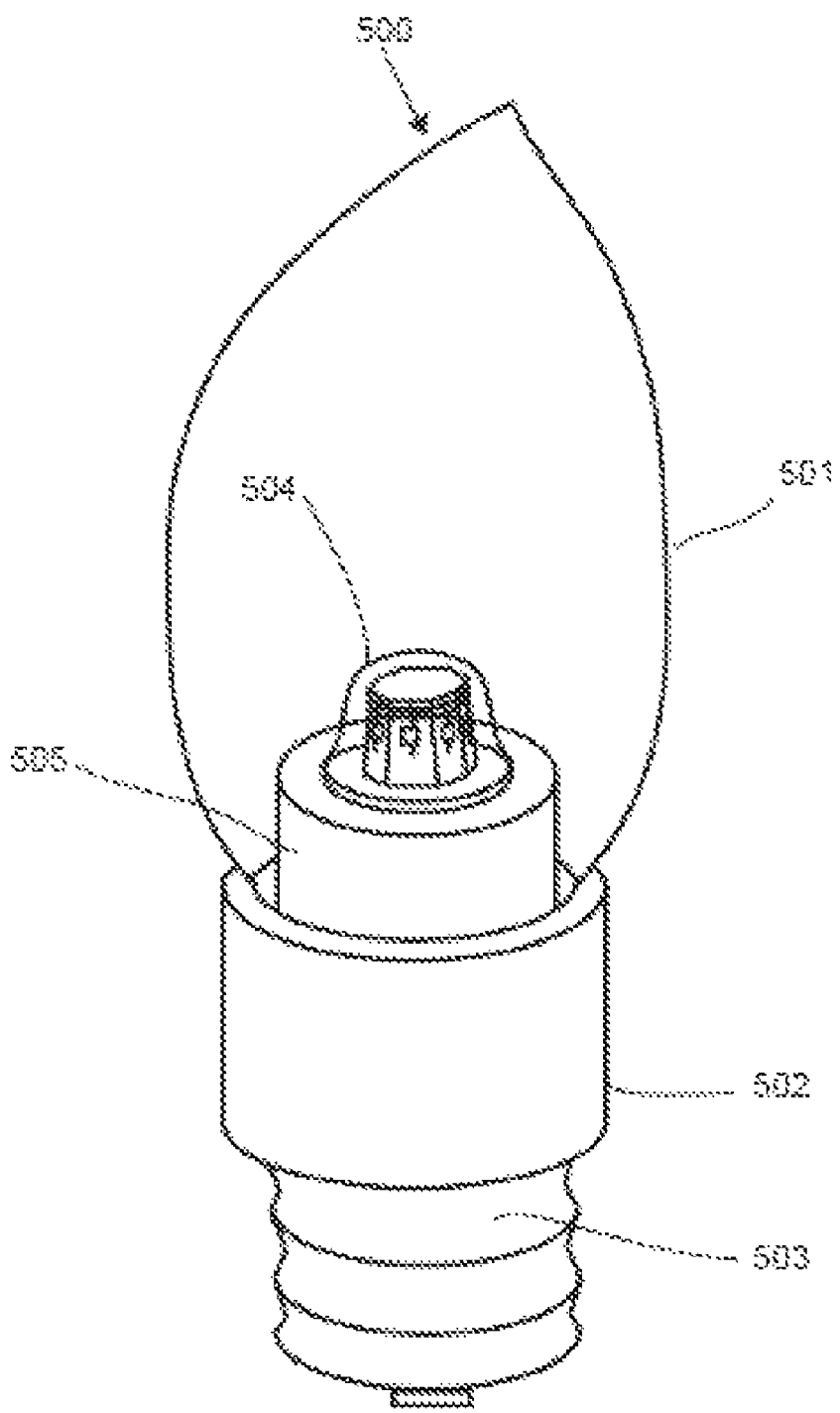
FIG. 5 is a side elevation of a decorative, candelabra style light bulb according to the present invention.
Figure 6:
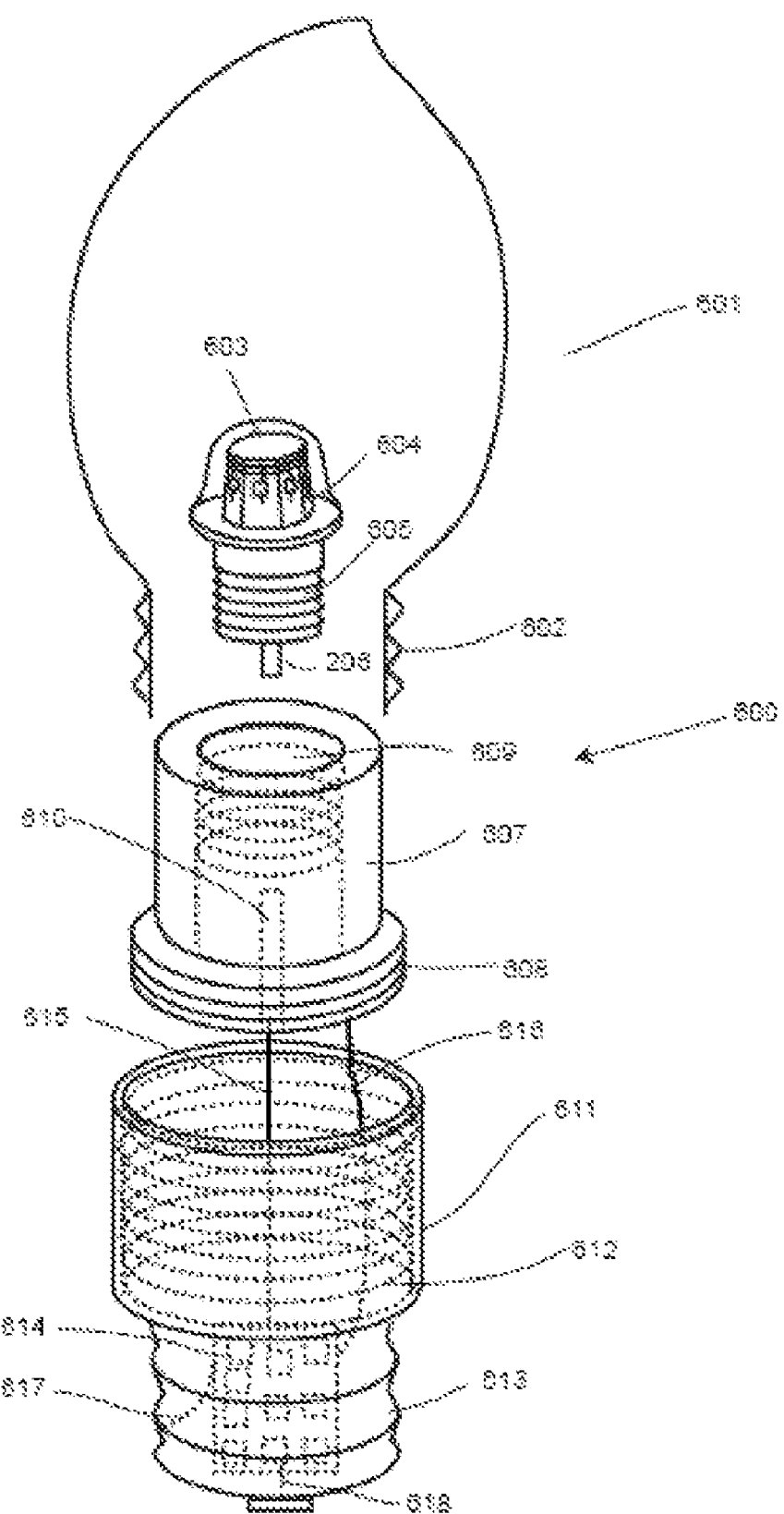
FIG. 6 is an exploded view, in partial transparency, of the light bulb of FIG. 5.
Figure 7A:
FIGS. 7a through 7f are schematics of a number of possible lead frame shapes for use in the present invention.
Figure 7B:
Figure 7C:
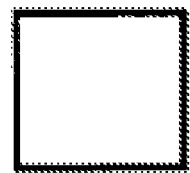
Figure 7D:
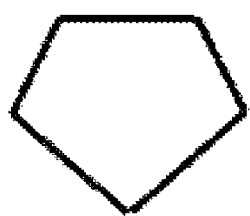
Figure 7E:
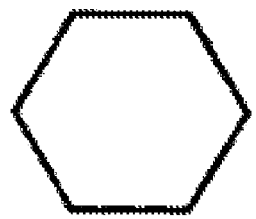
Figure 7F:
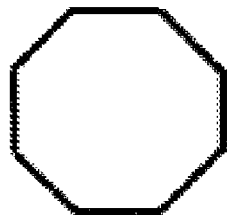

FIGS. 5 and 6 depict a decorative candelabra style bulb 500 (type D) and the same bulb 600 in an exploded view. The configuration is similar to the bulb depicted in FIGS. 1 and 2, with the only real change being the shape of the cover 601. The components illustrated are then similarly numbered as their counterparts in FIGS. 1 and 2 and otherwise function and relate in the same manner. As illustrated, the covers may be of any shape used in the industry today, or later. These shape types include: General ("A"), Globe ("G"), Decorative ("D"—which includes candelabra, teardrop and other imaginative shapes), and reflector bulbs (having a reflective coating inside the bulb), including General Reflectors ("R"), Floods ("FL"), Spots ("SP"), and Parabolic Reflectors ("PAR"). Also, covers may be made of textured material, including plain (or no texture) or frosted material, as is also known in the industry today.

In all above different embodiment, the total number of replaceable LEDs can be 1 to n, which is larger than 1. When multiple replaceable LEDs are used, the LEDs can mounted in either on a plain or different angle or different shape of the base.

The replaceable LEDs used in the invention is a light source to emit light in different directions due to its lead frame design as described in U.S. application Ser. No. 11/397,323. The shape of the lead frame for LED light source may vary according to purpose. FIG. 7 depicts a number of possible lead frame shapes on which LED chips are mounted. The different shapes of lead frame for LED can serve different applications. For instance, an LED could be mounted on all sides but the long side of the shape in FIG. 7b, which would provide light in an arc less than 360° (n less than the number of faces). Multiple LEDs (n greater than the number of faces) could also be mounted upon the same face, even if LEDs are not mounted upon all faces, providing more light.

Actual structuring of the bulbs according to the present invention then is a simple matter. The socket base is depicted in the Figures to fit in a standard Edison screw-type light socket ("MES") with its threaded portion. The base may of course be made to fit any type of lighting interface, including the candelabra screw base, as used in nightlights and other small lights, the simple plug in variety used in strings of mini lights (typically used for Christmas trees), the double contact bayonet cap ("BC") and current halogen fittings G4, GY4, and R7s-75. Adapting the disclosed preferred embodiment to fit these fittings should be intuitive for those skilled in the art.

In use, the current passes into the threaded portion of the socket base and into the control circuitry. The control circuitry then converts the AC current on to DC current to power the LEDs and passes the current into the interior socket which, in turn, passes the current to the LED light source and the individual LEDs. The light sources depicted and considered best mode of use in this Application are those depicted in parent Applications and feature a plurality of LEDs mounted on a lead frame in a manner to cast light in a 360 degree arc (though less than 360 degrees is possible, and may be desired, through limited placement of the LEDs on the lead frame). The lead frame provides adequate heat dissipation, physical mounting and electrical contact to the LEDs. When the LEDs eventually burn out (which would be many times longer than any bulb on the market today), the consumer merely removes the bulb from electrical contact and then removes the cover by merely twisting it off. The light source is then removed from the internal socket and replaced. The cover is replaces and the bulb returned to its original socket. The majority of the components are preserved, leading to less resource waste. It is possible for the internal socket to be permanently affixed to the socket base (with either a physical stop, an adhesive or a soldiered connection) as well as being able to be removed.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. A light bulb, comprising:
   a. a removable LED light source;
   b. a removable cover;
   c. a socket base capable of receiving the cover;
   d. control circuitry within the socket base;
   e. an interior mounting structure, having at least one face, for receiving the LED light source, said structure located at least partially within the socket base inside the cover; and
   f. operable electrical connections between the socket base and control circuitry and between the control circuitry and the LED light source.

2. The light bulb of claim 1, the removable LED light source and the mounting structure interfacing through an interlock interface.

3. The light bulb of claim 1, the mounting structure being permanently affixed within the socket base.

4. The light bulb of claim 1, the mounting structure being removable from the socket base.

5. The light bulb of claim 1, the mounting structure having a polygonal profile with n faces, n being an integer larger than 2.

6. The light bulb of claim 1, the removable LED light source being at least 1 removable LED.

7. The light bulb of claim 5, the removable LED light source being a plurality of removable LEDS that are mounted upon a plain surface.

8. The light bulb of claim 5, the removable LED light source being a plurality of removable LEDs selectively mounted so that at least one LED light source is mounted upon each face of the mounting structure.

9. The light bulb of claim 1, the cover having a texture selected from the set of textures consisting of clear and frosted.

10. The light bulb of claim 1, the cover having a type of shape selected from the set of shapes consisting of types A, G, D, R, FL, SP, and PAR.

11. The light bulb of claim 1, the socket base being selected from the set of bases consisting of candelabra screw bases, plug in bases, and base types MES, Be, G4, GY 4, and R7s-75.

12. The light bulb of claim 1, the LED light source being capable of emitting light in an arc of between 5° and 360°, inclusively, in a horizontal plain and arc between 5° and 360°, inclusively, in a vertical plain.

13. A light bulb, comprising:
   a. a removable LED light source
   b. a mounting structure for receiving the removable LED light source;
   c. electronic control circuitry to provide the electrical control to drive the removable LED light source;
   d. a housing to contain the mounting structure and electronic control circuitry;
   e. a standard light bulb base connected to the housing to facilitate the connection of the light bulb to a standard light bulb socket; and
   f. operable electrical connections between the light bulb base, electronic control circuitry and mounting structure so as to provide electrical power to the removable LED light source.

14. The light bulb of claim 13, the removable LED light source and the mounting structure interfacing through an interlock interface.

15. The light bulb of claim 13, the mounting structure being permanently affixed within the housing.

16. The light bulb of claim 13, the mounting structure being removable from the housing.

17. The light bulb of claim 13, the mounting structure having a polygonal profile with n faces, n being an integer larger than 2.

18. The light bulb of claim 13, the removable LED light source being a number of removable LEDs equal to n, which is an integer equal or larger than 1.

19. The light bulb of claim 18, wherein the number of removable LEDs are mounted in a plain surface.

20. The light bulb of claim 18, the number of removable LEDs being selectively mounted on up to n faces of the mounting structure.

21. The light bulb of claim 13, the standard light bulb base being selected from the set of bases consisting of candelabra screw bases, plug in bases, and base types MES, BC, G4, GY 4, and R7s-75.

22. The light bulb of claim 13 further comprising a cover, the housing being capable of receiving said cover.

23. The light bulb of claim 22, the cover having a texture selected from the set of textures consisting of clear and frosted.

24. The light bulb of claim 22, the cover having a type of shape selected from the set of shapes consisting of types A, G, D, R, FL, SP, and PAR.

* * * * *